United States Patent [19]

Tsaliovich et al.

[11] 4,425,542
[45] Jan. 10, 1984

[54] METHOD AND APPARATUS FOR MEASURING THE SURFACE TRANSFER IMPEDANCE OF A PIECE OF SHIELDED CABLE

[75] Inventors: Anatoly Tsaliovich, Wheaton; John Kincaid, Batavia, both of Ill.

[73] Assignee: Belden Corporation, Geneva, Ill.

[21] Appl. No.: 413,603

[22] Filed: Sep. 1, 1982

[51] Int. Cl.³ .................................................. G01R 27/04
[52] U.S. Cl. ................................. 324/58 R; 324/58 A
[58] Field of Search ...................... 333/219, 222, 227; 324/58 R, 58 A, 58 C

[56] References Cited

U.S. PATENT DOCUMENTS

| | | | |
|---|---|---|---|
| 3,711,942 | 1/1973 | Reynolds | 29/593 |
| 3,839,672 | 10/1974 | Anderson | 324/51 |
| 3,952,245 | 4/1976 | Miller | 324/57 R |

OTHER PUBLICATIONS

Oakley, R. J., "Surface Transfer Impedance Measurements—A Practical Aid to Communication Shielding Design," *Proceedings of the 18th International Wire and Cable Symposium*, Atlantic City, Dec. 1969 (Lachine, Quebec, Canada, Northern Electric Co., 1969).

Rhode & Schwartz Sales Co., Inc., Absorbing Clamps Data Sheet, Fairfield, N.J.

Simons, K. A., A Review of Measuring Techniques for Determining the Shielding Efficiency of Coaxial Cables, IEC Doc. SC46A/WG1, pp. 15-20.

*Primary Examiner*—Stanley T. Krawczewicz
*Assistant Examiner*—Jose M. Solis
*Attorney, Agent, or Firm*—Fitch, Even, Tabin & Flannery

[57] ABSTRACT

A method for measuring surface transfer impedance of shielded cable within a frequency range below about 1 GHz is implemented with a single test fixture. The test fixture provides a conductive cylindrical chamber which opens for installation of a sample of shielded cable. The ends of the chamber are blocked by ferrite toroids to prevent radiation of high frequency electromagnetic energy. One end of the cylindrical chamber may be externally short-circuited to the cable shielding for low frequency measurements. A current source connects between the sample shielding and the conductive chamber boundary at the other end of the chamber. Current flow at low frequencies is limited to the region between the current source and the short circuit. Current flow at high frequency is limited to the region between the toroids. The cable shielding and the fixture body beyond the toroids are short-circuited for high-frequency tests and open-circuited for low frequency tests. The induced voltage in the cable is measured through feed-throughs provided in the test fixture. The current source uses an isolation transformer to avoid ground loops in the low-frequency range.

15 Claims, 9 Drawing Figures

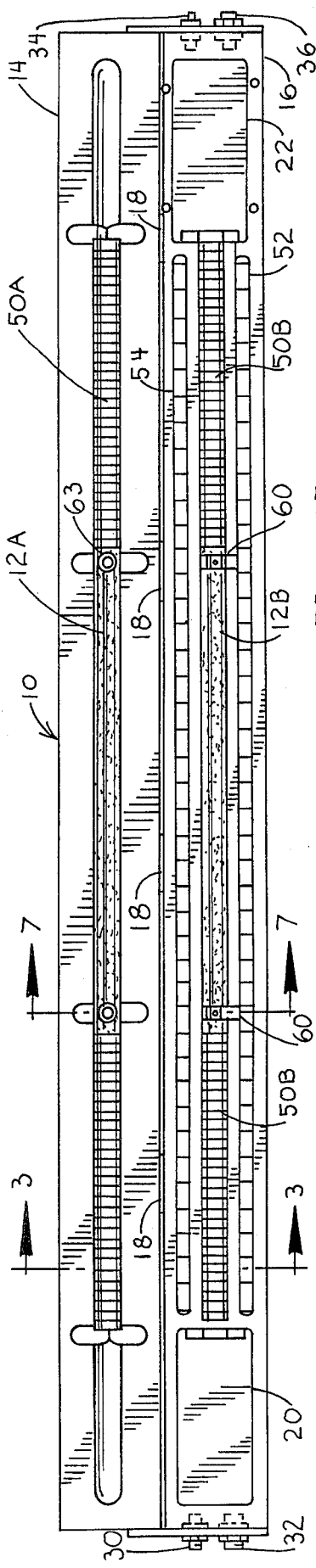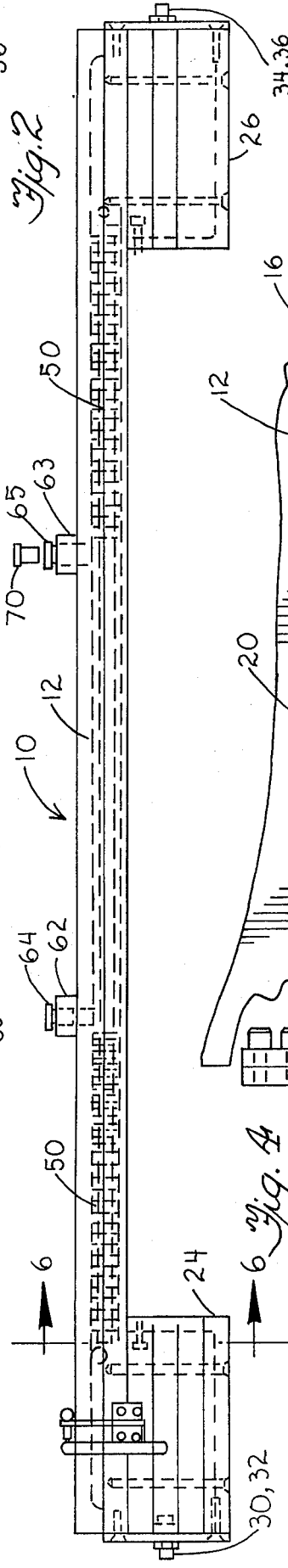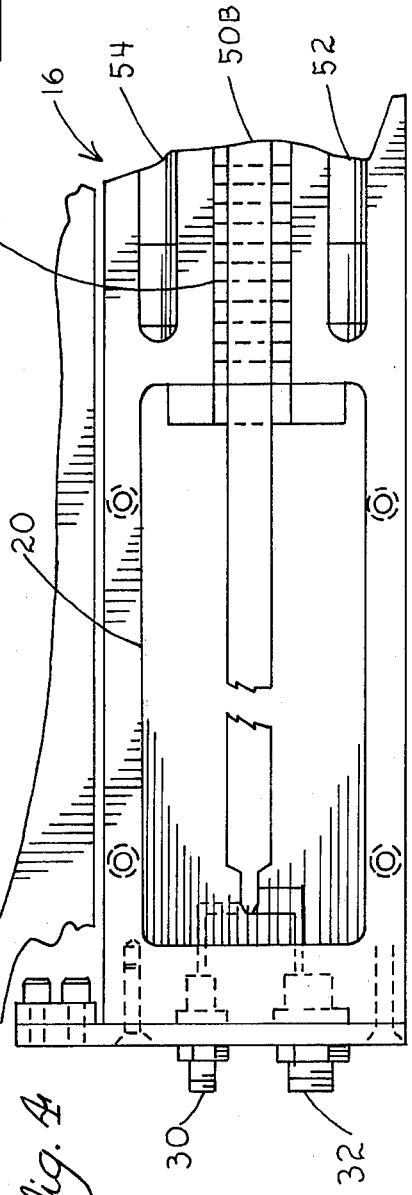

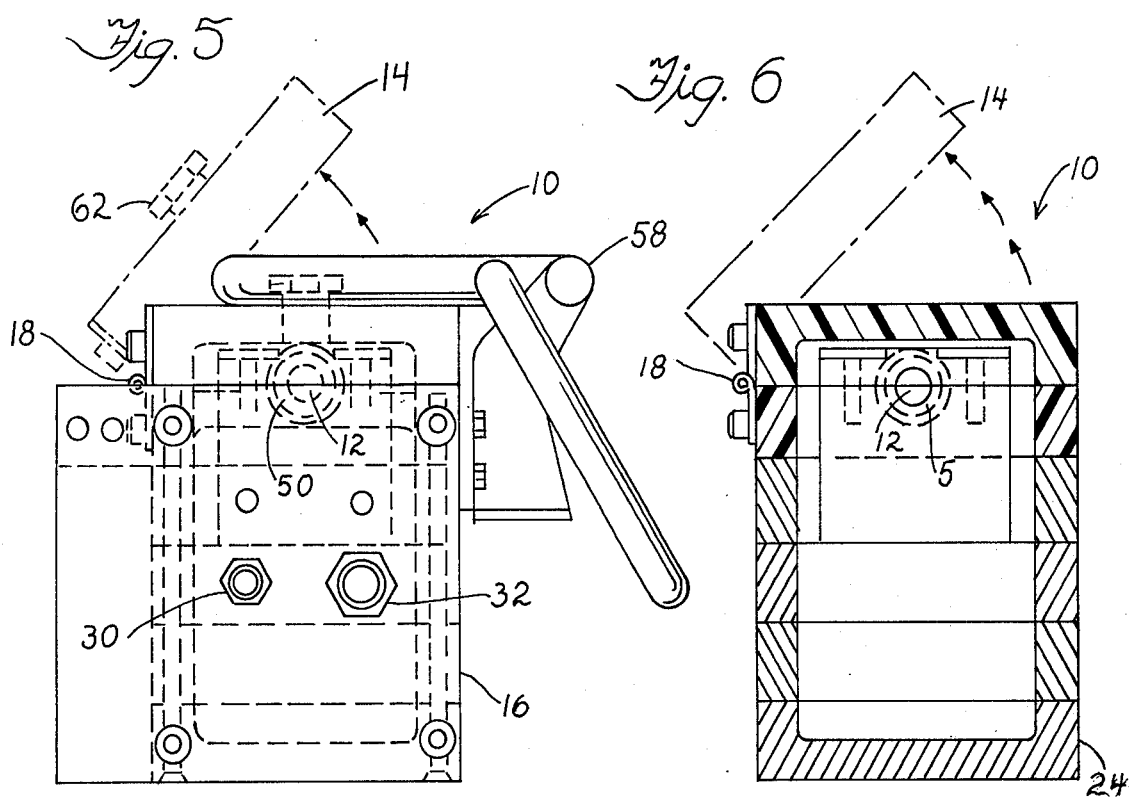

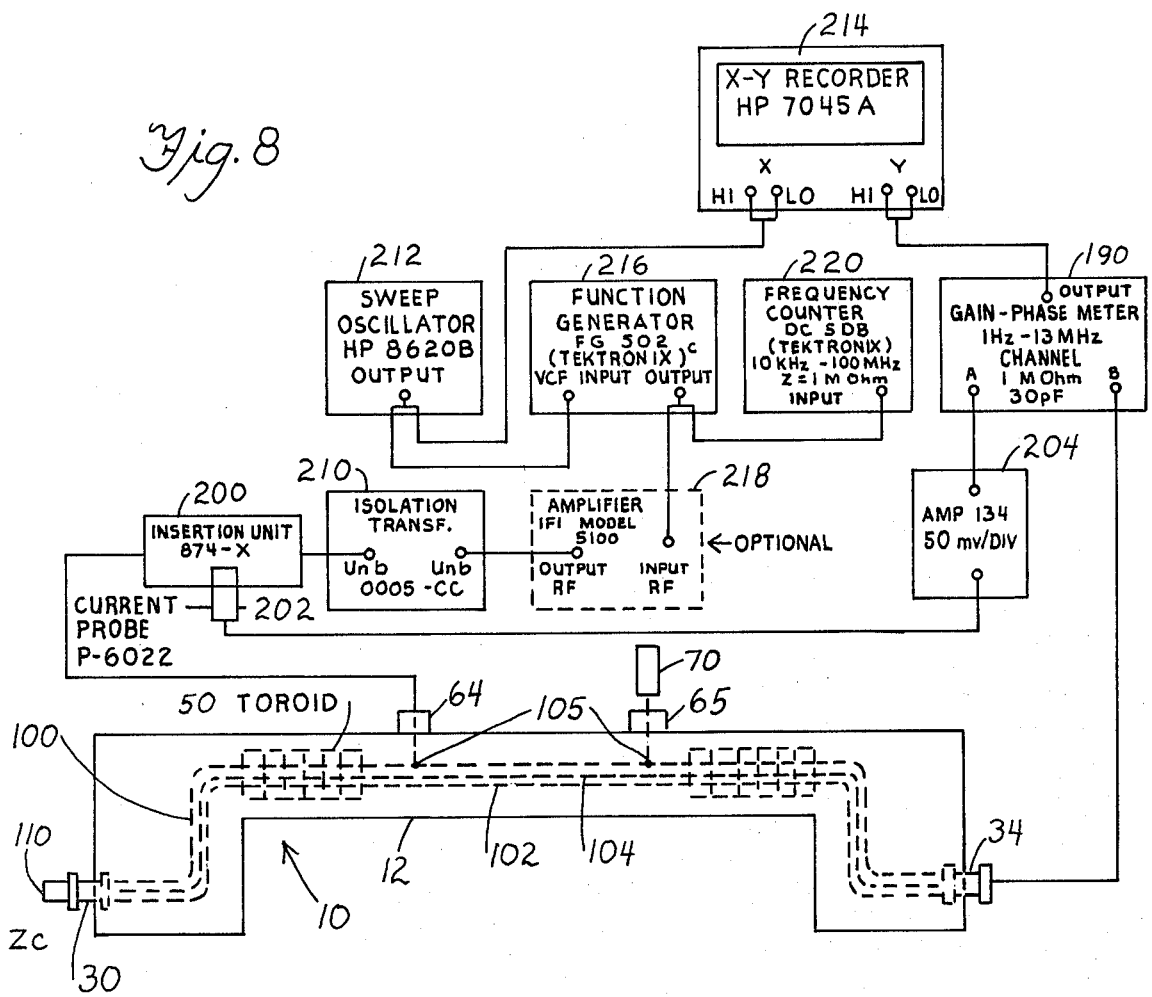
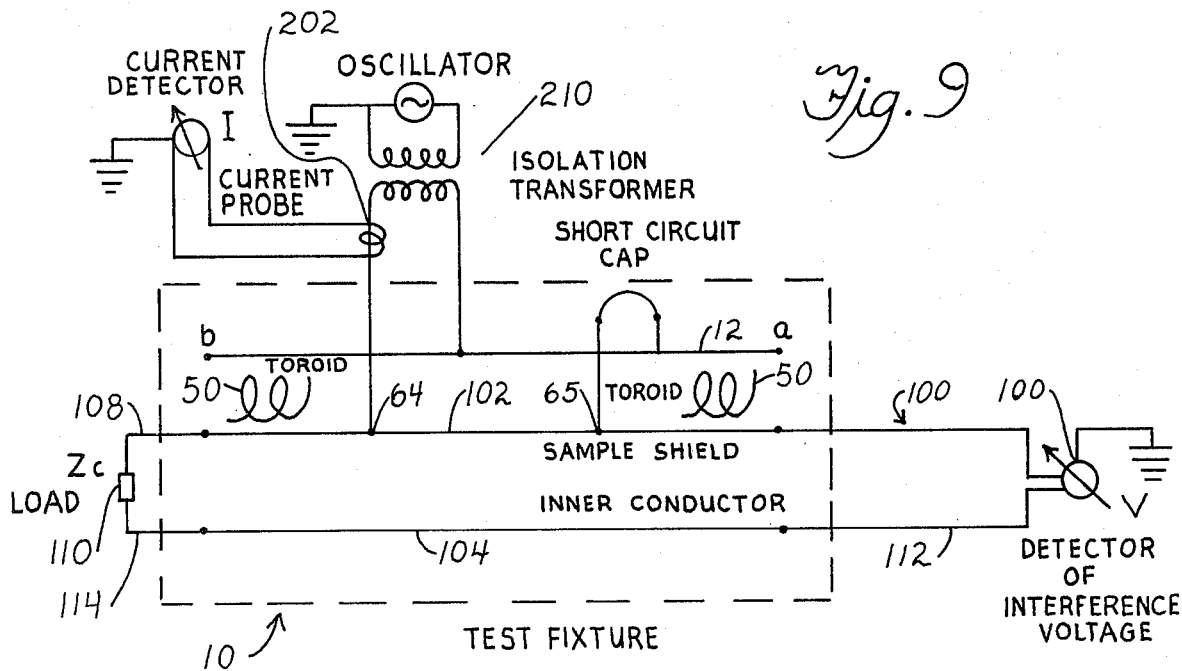

METHOD AND APPARATUS FOR MEASURING THE SURFACE TRANSFER IMPEDANCE OF A PIECE OF SHIELDED CABLE

This invention relates generally to an electrical measuring and testing method and apparatus. More particularly, the invention relates to a method and apparatus for measuring surface transfer impedance of shielded cable over a large frequency range in a single apparatus.

BACKGROUND OF THE INVENTION

Shielded cables in which at least one central conductor is surrounded by one or more conductive shields are typically employed in environments where it is important to isolate electric circuits from the effects of outside disturbances. These disturbances generally consist of varying electromagnetic fields external to the cables. The disturbances causes currents to flow in the shields. The shield currents, in turn, give rise to voltage disturbances carried over the internal conductor. The shielding is effective to the extent that currents induced in the shield are ineffective in generating disturbances in the inner conductors.

Surface transfer impedance is one measure of shielding effectiveness. As defined, for example, in Oakley, R. J., "Surface Transfer Impedance Measurements—A Practical Aid to Communication Cable Shielding Design," *Proceedings of the 18th International Wire and Cable Symposium*, Atlantic City, December 1969 (Lachine, Quebec, Canada, Northern Electric Co., 1969), surface transfer impedance is the magnitude of the ratio per unit length of the longitudinal induced voltage along a length on the inside surface of the shield to the current made to flow in a circuit including the shield and a return path outside of the shield. The voltage on the inside of the shield is, of course, induced by the current flowing on the outside of the shield.

In the prior art, it was considered easier to measure shielding effectiveness without obtaining the absolute value of the surface transfer impedance as a function of frequency, as exemplified by U.S. Pat. No. 3,839,672 issued to Anderson and assigned to the assignee of the present invention. The Anderson invention has been implemented in a testing system that measures the signal level of a signal radiated by a piece of cable relative to the signal level of a reference signal applied to the cable.

Recent federal regulations, in particular, 47 CFR Part XV, require measurements of the absolute values of systems radiated emissions rather than the relative shielding effectiveness as obtained by the Anderson method. Cable radiated emissions may be calculated from measured values of surface transfer impedance. There is accordingly need for systems useful for making rapid and economical surface transfer impedance measurements.

Surface transfer impedance has been determined in accordance with the theoretical definition by measuring the voltage generated along a length of cable between the shield and an inner conductor of the cable resulting from a current flowing in the shield with a return path outside of the shield. Practical measurements were made in the past by placing a length of cable inside of a conducting tube. The conducting tube was connected to the cable shield to provide the requisite external circuit through which current could be passed. The resulting induced voltage was then measured at one end of the sample.

It is necessary in making such measurements to limit carefully the section of sample in which current is permitted to flow in order to define the length over which transfer impedance is measured. It is also necessary to control the current flow direction in order to determine the input current which is effective in generating the measured output voltage so that the measured impedance is substantially in accord with its theoretical definition.

In the prior art as described by Simons, K. A., "A Review of Measuring Techniques for Determining the Shielding Efficiency of Coaxial Cables," IEC Doc. SC46A/WG1(1973) p. 15, the current conduction distance was limited at low frequencies by short-circuiting one end of the shield to the conducting tube and applying the input current to the other end. This method was satisfactory in a frequency regime ranging up to about 30 MHz.

Above about 30 MHz, the method just described gave rise to difficulties because the conducting tube and sample shield acting together produced standing waves which distorted the measured test results. Therefore, prior art high frequency transfer impedance measurements were made by blocking the ends of the cavity between the tube and shield with parallel resistances and toroids having high series loss as described by Simons pp. 15-20. This technique is called the terminated triaxial method. The toroids and a parallel resistor effectively terminated the transmission line formed by the tube and the cable shield into its characteristic impedance. The cable shield is connected to the conducting tube at points outside of the section blocked by the toroids. The connections of the shield to the conducting tube outside of the toroids, as required by the terminated triaxial method, required that the low frequency limit of the high frequency test range be not less than 3-10 MHz. The terminated triaxial method is known to be useable up to frequencies of about 1 GHz.

Therefore, one of the problems associated with surface transfer impedance measurements in the prior art has been that different test sets have been required for different frequency regimes. It is convenient, however, to have two completely different test configurations for low frequency (up to 30 MHz) and high frequency (say above 1 to 5 MHz) measurements.

A second problem in the terminated triaxial method is associated with the necessity of pulling the sample through the conducting tubes and toroids. As a result, generally, the connectors can be attached to the sample only after inserting the sample into the fixture. Hence, the sample with connectors cannot be prepared beforehand, thereby making it difficult to conduct mass tests in industrial applications or to test assemblies with permanently mounted connectors. The need for repetitive pulling and connector soldering makes it difficult for the operator to perform the necessary changes, adjustments, and mechanical manipulations without affecting the test conditions of the samples. These are especially important in performance stability measurements and research applications. Finally, the terminated triaxial method involves a time-consuming procedure of installing and removing the samples in the fixture and connecting cable shielding to probes in the chamber.

SUMMARY OF THE INVENTION

The present invention is related to methods overcoming the aforementioned difficulties, and to a test fixture implementing the methods. The methods and the fixture make surface transfer impedance measurements possible over the entire frequency range of interest using only one fixture and eliminating the need for pulling samples through tubes. The fixture incorporates the advantages of the terminated triaxial method modified to allow the fixture to be used unchanged for both low-frequency and high-frequency tests. The methods also solve the problem of defining the current path in the shielding at low frequencies. Instead of making the short circuit connections between shield and conducting tube at the ends of the sample, a single short circuit is made within a cavity formed between two toroidal plugs. Input current connections are made to the cable shielding and tube within the cavity. The length of current path along the shield is then simply the distance between the current source and short circuit connections to the shield. The invention also envisions the use of means such as an isolating transformer between a grounded current source and the shield-conducting tube circuit to isolate that circuit from ground. The input current connections to shield and tube may then be taken from the secondary winding of the isolating transformer so that substantially all the input current flows into the shield-conducting tube circuit.

Briefly, the method of the present invention may be practiced by disposing a piece of cable longer than a predetermined length substantially coaxially within an elongated, conductive tube. A cavity of about the predetermined length is then formed within the tube by blocking the ends of the cavity with ferrite toroids. Outside of the toroids, the circuit formed by the conducting tube and the test cable outer conductor is open at both ends for low frequency measurements. The toroids are substantially impervious to electromagnetic radiation but maintain high electrical resistance between the cable shielding and the conductive tube. The resulting cavity has substantially the predetermined length and coaxially surrounds the predetermined length of cable. The ends of the cavity are substantially flat planes perpendicular to the tube axis. The interior of the resulting cavity is substantially transparent to electromagnetic radiation. The cable shield at one end of the cavity is electrically connected to the conductive interior of the tube at the same end to provide a conductive path across that end of the cavity, thereby defining a conducting end. The other end of the cavity then comprises the open end. The end of the piece of cable nearer (along the cable) to the open end of the cavity is electrically terminated by connecting a predetermined impedance between the outer shield and the inner conductor at that end. Electrical voltage of selected frequencies within the low frequency range may then be applied between the conductive tube and shielding at the open end of the cavity, and the resulting input current measured. The input current will flow in the circuit formed by the voltage source, outer surface of shielding, electrical connection between shielding and conductive tube, and the conductive tube. The resulting voltage between the inside of the shielding and the cable conductor and the input current are measured, and the surface transfer impedance over the predetermined length of cable is determined from their ratio.

High frequency measurements differ from low frequency measurements in that the short circuit at the conducting end is disconnected and is replaced by a resistance equal to the characteristic impedance of the circuit. The conducting tube and outer conductor are short-circuited behind the toroids at both ends, and electrical voltage of selected high frequencies is applied at the open end within the cavity. The toroids provide absorptive boundaries at the ends of the cavity and confine the currents induced on the shield surface to the predetermined length.

The test fixture of the present invention permits application of the method just described. Briefly, the test fixture, when assembled, includes a structure with the conducting tube, toroids, and feed-throughs for making quick electrical connections (two isolated feed-throughs to provide open-circuit connections beyond the toroids for low-frequency tests and two non-isolated feed-throughs for short-circuit connections for high frequency tests), all contained within a box-like structure.

To eliminate the need for pulling the test cable through the tube, the box-like structure separates into an open position consisting of two pieces which separate on a mid-plane dividing the conducting tube and each toroid into two half cylinders. The two pieces are readily separated for the lateral introduction and connection of a section of cable sample for testing. Connections are made when the sample is placed in the test fixture permitting either high frequency measurements using the prior art method or low frequency measurements in keeping with the present invention to be made.

It is an objective of the present invention to provide an improved method and an improved apparatus for measuring the surface transfer impedance of shielded cable.

It is another objective of the invention to provide a single apparatus useful for measuring surface transfer impedance over a frequency range below about 1 GHz.

Other objectives of the invention will be apparent from the following description of a specific embodiment as illustrated in the accompanying drawings.

DESCRIPTION OF THE DRAWINGS

FIG. 1 is a plan view of an apparatus, constructed in accordance with the principles of the present invention, for measuring the surface transfer impedance of shielded cable, the apparatus being shown in an open position;

FIG. 2 is a side view of the apparatus illustrated in FIG. 1, shown in a closed position;

FIG. 3 is a sectional view of the apparatus section shown in FIG. 1, taken along line 3—3 of FIG. 1;

FIG. 4 is an enlarged view of a portion of one end of the base of the apparatus shown in FIG. 1;

FIG. 5 is an end view of the apparatus shown in FIG. 2;

FIG. 6 is a sectional view of the apparatus shown in FIG. 2, taken along line 6—6 in FIG. 2;

FIG. 7 is a sectional view of the apparatus shown in FIG. 1, taken along line 7—7 in FIG. 1;

FIG. 8 is a block diagram illustrating a low frequency test setup for performance of the method of the present invention using the apparatus shown in FIG. 1; and FIG. 9 is a schematic illustration of the electrical connections to the apparatus of FIG. 1 as used with the test setup shown in FIG. 8.

DESCRIPTION OF A SPECIFIC EMBODIMENT

Description of Apparatus

As illustrated in FIGS. 1, 2 and 3, a conductive, box-like shaped measurement fixture 10 contains an elongated, cylindrical chamber 12. The chamber 12 may be formed by milling cooperating semi-circular grooves 12A and 12B, respectively, in a top plate 14 and a bottom plate 16 made from rectangular aluminum bar stock. The top and bottom plates 14, 16 may be connected along their longest edges by hinges 18 to permit access to the chamber 12.

As illustrated in FIGS. 1 and 4, the lower groove 12B terminates at each end at apertures 20, 22 cut in the ends of the bottom plate 16. A conducting box 24, open on one side, is attached to the underside of the bottom plate 16 with the aperture 20 communicating with the interior of the box 24. A box 26, substantially identical to the box 24, is similarly attached to the underside of the bottom plate 16 in similar relation to the aperture 22.

The chamber 12 and the interiors of the boxes 24 and 26 comprise a substantially closed, continuous volume delimited by a conducting boundary when the top plate 14 is closed upon the bottom plate 16. The length of the elongated cylindrical chamber 12 is approximately 1 m.

Each of the boxes 24, 26 is respectively provided with two electrical feed-throughs 30, 32 and 34, 36, located at the ends of the fixture 10. The feed-throughs 30, 32 are shown in greater detail in FIGS. 4 and 5. Feed-throughs 30 and 34 are isolated from, respectively, the boxes 24, 26 whereas feed-throughs 32 and 36 are non-isolated.

The grooves 12A, 12B are packed for approximately ⅓ of their length from either end with half-toroid pieces of ferrite 50A, 50B, as shown especially in FIGS. 1, 3 and 4. The pieces of ferrite 50A cooperate with the pieces of ferrite 50B to form ferrite toroids 50 at each end of the cylindrical chamber 12, as shown in FIGS. 2, 3, and 7. The remaining third of the grooves 12A, 12B may respectively be filled with semicircular rubber rings 51A, 51B and light plastic foam to hold a test sample concentric with the cylindrical boundary of the cylindrical chamber 12.

A pair of slots 52, 54 on the bottom plate 16 are provided on either side of, and substantially parallel to the groove 12B, as shown in FIGS. 1 and 4. The slots are filled with copper RF fingers 56, such as the Series 97-500 Sticky Fingers manufactured by Instrument Specialites Co., Delaware Watergap, PA 18327, as shown in FIGS. 3 and 7. The RF fingers 56 provide good electrical contact between the top and bottom plates 14, 16 when the fixture 10 is closed to form the cylindrical chamber 12.

A locking mechanism 58 is provided in the specific construction to hold the top plate 14 tightly against the RF fingers 56, which behave as compression springs, to insure good contact. A pair of insulated spring clips 60, shown in FIGS. 1 and 7, screw-mounted on the bottom plate 16, may be used to hold the cable sample firmly in place when the fixture 10 is open. The spring clips 60 are located in the central third of the cylindrical chamber 12, approximately adjacent to the pieces of ferrite 50B. The spring clips 60 are provided with openings providing access to the cable sample shielding from apertures in the top plate 14, as will be discussed.

A pair of threaded adapters 62, 63 are screwed into the outer surface of the top plate 14 to provide threaded passages communicating with the cylindrical chamber 12 at positions just above the respective spring clips 60. A pair of spring-loaded probes 64, 65 screw, respectively, into each of the adapters 62, 63 as shown in detail in FIG. 7. The tip of each of the probes 64, 65 passes through a respective opening of a spring clip 60 to make contact with the cable sample shield when the sample is in place and the fixture is closed. The probes are commercially available from ATEC, Pomona, CA, Model SPA-3H.

MODE OF OPERATION

A sample 100 of cable with shielding 102 and inner conductor 104 and insulating jacket 105 is disposed symmetrically within the chamber 12, as indicated in FIG. 8, and connected as shown in the circuit diagram, FIG. 9. The ends of the cable sample 100 may be coiled in the boxes 24, 26 which are provided for test purposes. A small portion of the insulating jacket 105 is removed from the sample 100 at the contact points where the tips of probes 64, 65 contact the shielding 102. The tips thereby make electrical contact with the shielding 102 when the fixture 10 is in a closed position.

The shielding terminals 106, 108 of the sample 100 may be connected to feed-throughs 30, 34 of the fixture 10 for low frequency measurements and to feed-throughs 32, 36 for high frequency measurements. The inner conductor 104 terminals 112, 114 are also connected to feed-throughs 30, 34 for low frequency measurements and feed-throughs 32, 36 for high frequency measurements. In the case of multiple conductor cables the multiple inner conductors are short-circuited to each other to form a single effective inner conductor 104.

The feed-throughs 30, 32 are connected externally by a load 110 having the characteristic impedance $Z_c$ of the cable. Termination of the cable sample 100 by its characteristic impedance greatly eliminates unwanted reflections from the terminated end. A short-circuit cap 70, idealized in FIG. 2, screws into the top of the probe 65 to make an electrical connection between the shielding 102 and fixture 10 for low frequency measurements. Thus, as indicated schematically in FIG. 9, the impedance 110 and the short-circuit at 65 provide low frequency test terminations.

One channel of a gain-phase meter 190, such as a Hewlett-Packard 3575A may be connected across the terminal 34 as shown in FIG. 8.

An insertion unit 200, which may be a General Radio Type 874-X, is connected to the probe 64. A current probe 202, which may be a Tektronix P6022, is connected into the insertion unit and to a current amplifier 204, such as Tektronix Type 134, all as shown in FIG. 8. The current amplifier 204 output feeds the remaining channel of the gain-phase meter 190.

The free terminal of the insertion unit 200 connects to the secondary of an isolation transformer 210 such as a North Hills Unbalanced-to-Unbalanced Type 005CC.

The sweep output of a sweep oscillator 212 such as a Hewlett-Packard HP8620B drives the x-axis position of an x-y recorder 214 and the VCF input of a function generator 216 such as a Tektronix FG502. The function generator 216 is normally used in its SINE function setting for the tests described herein. The output of the function generator 216 may be amplified by a wide band amplifier 218 and monitored by a frequency counter 220, as shown in FIG. 8. The amplifier 218 output drives the primary of the isolating transformer 210. The y-axis position of the x-y recorder 214 is driven by the output of the gain-phase meter 190.

Care must be taken with electrical groundings to avoid ground loops. In particular, the fixture 10 and the insertion unit 200 must be isolated from the system electrical ground, including the current probe 202 grounding wire. Special care should be taken to provide a good ground for the gain-phase meter 190.

In a specific application of the method of the present invention the sweep oscillator 212 may be run at a number of different frequencies. The gain-phase meter 190, set to its B/A position, will then drive the y-axis indication of the x-y recorder 214 proportionally to the logarithm of the surface transfer impedance in ohms/meter, expressed in decibels. The corresponding frequency will be indicated on the x-axis.

The cable sample 100 is connected for low frequency measurements when the sweep oscillator is set at frequencies less than 10 MHz. It is connected for high frequency measurements according to the terminated triaxial method in a way well-known in the art. In this case the non-isolated feed-throughs 32, 36 are used and the short circuit cap 70 is replaced by an impedance matched to the circuit formed by the cable shield and the fixture.

It will, of course, be understood that modification of the present invention in its various aspects would be apparent to those skilled in the art, some being apparent only after study and others being a matter of routine design. For example, the particular construction of the fixture shown in FIGS. 1–7 is not a necessary feature of the invention. Various other arrangements could be found suitable for holding a cable sample and for applying a radio frequency current to the shielding. It is also not necessary that the signal be applied to the shielding and measured at an end of the cable. The converse procedure would also work.

Persons skilled in the art will conceive of other forms and arrangements of electronic components which will also serve the purpose of surface transfer impedance determination. As such, the scope of the invention should not be limited by the particular embodiment, specific construction, and detailed method described herein but should be defined only by the appended claims and equivalents thereof.

What is claimed is:

1. A method for measuring the surface transfer impedance of shielded cable over a wide frequency range above and below about 10 MHz by measuring the surface transfer impedance of a predetermined length of a longer piece of cable, the cable having an outer shield and an inner conductor, the method comprising the steps of:
    disposing a piece of such cable, longer than the predetermined length, within a hollow electrically conductive member, thereby conductively laterally delimiting a cylindrical region substantially coaxially containing said piece of cable;
    delimiting said cylindrical region at ends separated by substantially said predetermined length by making said ends substantially absorptive of electromagnetic radiation while maintaining a high electrical resistance between the shielding of said cable and said hollow conductive member, thereby providing a cavity having the shielding of said predetermined length of said cable as a boundary;
    electrically connecting the shielding of said cable at one extreme of said predetermined length to said electrically conductive member with a short circuit, thereby providing a conducting end of said cavity for measurements at frequencies below about 10 MHz, and replacing said short circuit with a matched impedance for measurements at frequencies above about 10 MHz;
    electrically terminating an end of said piece of cable by connecting the shielding and conductor at that end with a connection having predetermined impedance, the terminated end being further along the cable from the conducting end of said cavity than from the other end of said cavity;
    applying measured input electrical energy at predetermined frequencies below about 1 GHz to a first point on said shielding and a second point on one of said electrically conductive member and said inner conductors; and
    measuring output electrical signals between a third point and a fourth point, said third point being on said shielding and said fourth point being on the other of said electrically conductive member and said inner conductor;
    wherein said input electrical energy comprises one of measured voltage and measured current and said output electrical signals are the other of voltage and current, and the locations of said first point and second point and said third point and fourth point, make said measurement substantially determinative of the surface transfer impedance of said predetermined length of said cable.

2. A method for measuring the surface transfer impedance according to claim 1 wherein said first point is located at the end of said cavity opposed to said conductive end and said second point is on said electrically conductive member at the same end as said first point.

3. A method for measuring the surface transfer impedance of shielded cable according to claim 1 or claim 2 wherein said third point and said fourth point are at the end of said longer piece of cable opposed to said terminated end.

4. a method for measuring the surface transfer impedance of shielded cable according to claim 1 or claim 2 wherein said input electrical energy comprises an alternating voltage applied through an isolating transformer.

5. A method for measuring the surface transfer impedance of shielded cable according to claim 4 wherein the current through the secondary of said isolating transformer is measured and the voltage between said third point and said fourth point is measured, whereby the relationship between said measured current and voltage determine uniquely the surface transfer impedance of said predetermined length of cable.

6. A method for measuring the surface transfer impedance of shielded cable over a wide frequency range above and below about 10 MHz by measuring the surface transfer impedance of a predetermined length of a longer piece of cable, the cable having an outer shield and an inner conductor, the method comprising the steps of:
    disposing a portion of such piece of cable longer than said predetermined length substantially coaxially within an approximately circularly cylindrical chamber defined by an electrically conductive member;
    delimiting a cavity of substantially said predetermined length within said chamber by establishing first and second positions substantially impervious to electromagnetic radiation while maintaining a high electrical resistance between the shielding of said cable and said conductive member, said first and second positions being spaced by substantially said predetermined length, thereby defining a cavity substantially coaxially surrounding said predetermined length of cable;

short-circuiting said shield adjacent to said first position to said electrically conductive member adjacent to said first position, thereby providing one conducting end of said cavity for measurements at frequencies below about 10 MHz, and disconnecting said short circuit for measurements at frequencies above about 10 MHz;

electrically terminating the end of said piece of cable nearer said second position by connecting said outer shield and said inner conductor at said end with a connection having pre-determined impedance;

applying predetermined input electrical exitations having predetermined frequencies below about 1 GHz to a first point and a second point; and measuring an output electrical signal between a third point and a fourth point;

wherein said input electrical excitation is one of voltage and current and said output electrical signal is the other of voltage and current, and said first point and second point and said third point and fourth point make said measurement substantially uniquely dependent upon the surface transfer impedance of said predetermined length of cable.

7. A test fixture for measuring the surface transfer impedance of a sample of a shielded cable over a wide frequency range above and below about 10 MHz, the cable having an outer shield and an inner conductor, the test fixture comprising:

enclosure means for defining a cylindrical region having a conducting boundary and substantially coaxially containing and defining a length of the shielded cable sample;

excitation means for exciting a substantially determined alternating current limited to said defined length on the outside of said shielded cable sample, said current having a return path in said conducting boundary, and said current being variable in frequency below about 1 GHz;

measurement means responsive to said current and to a voltage between said inner conductor and said outer shield for determining the surface transfer impedance of said sample.

8. A test fixture according to claim 7 wherein said enclosure means comprises a plurality of members relatively movable between a closed position and an open position, said members cooperating to define said cylindrical region when in the closed position, and said members providing space for insertion of said cable sample when in the open position.

9. A test fixture according to claim 8 wherein said enclosure means is further characterized by a plurality of feed-throughs between the outside and inside of said test fixture, and the cable sample is accessible for connection to said feed-throughs when said members are in the open position, whereby a first connection of said feed-throughs may be made for measurements with said current having a frequency less than about 10 MHz, and a second connection of said feed-throughs may be made for measurements with said current having a frequency greater than about 10 MHz.

10. A test fixture according to claim 9 wherein at least one of said feed-throughs is isolated and at least one of said feed-throughs is not isolated from said fixture.

11. A test fixture according to claim 7 wherein said enclosure means includes a feed-through containing a conducting probe for contacting the shield of said cable sample, and said probe includes means for short-circuiting to said connecting boundary to the shield.

12. A test fixture for measuring the surface transfer impedance of a shielded cable sample over a wide frequency range above and below 10 MHz, the cable having an outer shield and an inner conductor, the test fixture comprising:

a hollow electrical conductor for defining a circularly cylindrical region having means for supporting the sample of the shielded cable substantially coaxially within said region, toroidal means for forming a cavity by delimiting a predetermined length of said region between two ends, said means being substantially impervious to electromagnetic radiation while maintaining a high electrical resistance between the shielding of the cable sample and said hollow conductor, short circuit means for connecting the cable sample shield to said hollow conductor at a location substantially adjacent to one of said ends, thereby providing a conductive end of said cavity, impedance connection means for connecting an impedance between the shielding and inner conductor of the cable sample at an end of the cable sample from outside of the test bed, source connection means for connecting a source of electrical excitation to deliver a determined input electrical excitation to the cable sample, and measurement connection means connectable to said cable sample and said hollow electrical conductor for connecting means to measure an output electrical signal related to said input electrical excitation by the surface transfer impedance of the cable sample.

13. A test fixture in accordance with claim 12 wherein said source connection means includes an isolation transformer.

14. A test fixture in accordance with claim 12 or claim 13 wherein said hollow electrical conductor comprises two members, said members co-operating when in a closed relationship to define said circularly cylindrical region, said members being readily separable to provide access for inserting the cable sample laterally between said members onto one of said members.

15. A test fixture in accordance with claim 14 wherein said toroidal means comprises a plurality of ferrite toroids disposed at each end of said circularly cylindrical region, each of said toroids being formed in two parts with one part of each toroid being fixed to a respective one of said members.

* * * * *

UNITED STATES PATENT AND TRADEMARK OFFICE
CERTIFICATE OF CORRECTION

PATENT NO. : 4,425,542
DATED : January 10, 1984
INVENTOR(S) : Tsaliovich and Kincaid It is certified that error appears in the above-identified patent and that said Letters Patent is hereby corrected as shown below:

Column 1, line 49: After "XV" insert --(FCC Docket 20780, 44FR 59580)--.

Column 2, line 42: "convenient" should read --inconvenient--.

Signed and Sealed this

First Day of May 1984

[SEAL]

Attest:

GERALD J. MOSSINGHOFF

Attesting Officer     Commissioner of Patents and Trademarks